United States Patent
Mu et al.

(10) Patent No.: US 10,057,530 B2
(45) Date of Patent: Aug. 21, 2018

(54) HIGH DYNAMIC RANGE IMAGING SENSOR ARRAY

(71) Applicant: BAE Systems Imaging Solutions Inc., San Jose, CA (US)

(72) Inventors: Bo Mu, San Jose, CA (US); Alberto M. Magnani, Danville, CA (US); Stephen W. Mims, San Diego, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 0 days.

(21) Appl. No.: 15/740,585

(22) PCT Filed: Aug. 18, 2016

(86) PCT No.: PCT/US2016/047602
§ 371 (c)(1),
(2) Date: Dec. 28, 2017

(87) PCT Pub. No.: WO2017/160336
PCT Pub. Date: Sep. 21, 2017

(65) Prior Publication Data
US 2018/0191979 A1    Jul. 5, 2018

Related U.S. Application Data

(60) Provisional application No. 62/309,377, filed on Mar. 16, 2016.

(51) Int. Cl.
*H04N 5/378* (2011.01)
*H04N 5/355* (2011.01)
(Continued)

(52) U.S. Cl.
CPC ............ *H04N 5/378* (2013.01); *H04N 5/341* (2013.01); *H04N 5/35545* (2013.01); *H04N 5/361* (2013.01); *H04N 5/3658* (2013.01)

(58) Field of Classification Search
CPC ...... H04N 5/378; H04N 5/3658; H04N 5/341; H04N 5/35545; H04N 5/361
See application file for complete search history.

(56) References Cited

U.S. PATENT DOCUMENTS

| | | | |
|---|---|---|---|
| 9,013,616 B2 | 4/2015 | Bechtel et al. | |
| 2002/0134918 A1* | 9/2002 | Miida | H03G 3/3084 250/214.1 |

(Continued)

OTHER PUBLICATIONS

International Search Report, PCT/US2016/047602, 4 pages.

*Primary Examiner* — Twyler Haskins
*Assistant Examiner* — Angel L Garces-Rivera
(74) *Attorney, Agent, or Firm* — Calvin B. Ward; Scott J. Asmus

(57) ABSTRACT

An apparatus having a rectangular imaging array characterized by a plurality of pixel sensors and a plurality of readout lines is disclosed. The apparatus has a plurality of column processing circuits, each column processing circuit being connected to a corresponding one of the readout lines and a plurality of signal injectors, one signal injector being connected to each of the readout lines. Each signal injector causes one of a predetermined number of voltages to be coupled to that readout line. An exposure for each of the pixel sensors is determined during image recording periods. The signal injectors inject a plurality of calibration voltages into the readout lines during calibration periods, and determines a gain function of an amplifier in one of the column processing circuits by measuring an output of the amplifier for the plurality of calibration voltages, the calibration period is between the imaging recording periods.

15 Claims, 5 Drawing Sheets

(51) Int. Cl.
    *H04N 5/361*  (2011.01)
    *H04N 5/341*  (2011.01)
    *H04N 5/365*  (2011.01)

(56) References Cited

U.S. PATENT DOCUMENTS

2006/0213258 A1  9/2006  Hale et al.
2008/0174685 A1  7/2008  Shan et al.
2015/0008307 A1  1/2015  Fowler
2015/0116539 A1  4/2015  Nayar et al.
2015/0156413 A1  6/2015  Do et al.

\* cited by examiner

HIGH DYNAMIC RANGE IMAGING SENSOR ARRAY

BACKGROUND

CMOS cameras typically form an image of a scene by imaging light from the scene onto an array of pixel sensors. Typically, each pixel sensor has one or more photodetectors. Each photodetector converts the light received during an exposure period into an electrical signal. The electrical signal is then digitized by an analog-to-digital converter (ADC) to generate a digital value representing the amount of light received during the exposure time period. The array is typically a two-dimensional array having thousands of columns and rows of pixels. The array is readout one row at a time using a separate column amplifier and ADC for each row.

In general, a photodiode has some range in which the signal from the photodiode is a monotonically increasing function of the light received in the exposure period. At the bottom of this range, the accuracy of the determination of the light intensity from the generated signal is limited by various sources of noise. Above this range, the output of the photodiode saturates, and hence, intensities above this range cannot be accurately measured. With current photodiodes, the range of usable signals is less than that needed to measure all of the intensities in many images. If the exposure is set to detect low level light signals, the bright regions of the image will be outside the range, and hence, saturated.

Prior art solutions for extending the high range of a pixel sensor typically utilize a second exposure or a second photodiode. In such schemes, the first exposure or photodiode is set to detect low light pixels. Pixel sensors that are subjected to high light intensities saturate, and hence, cannot provide useful information about the light intensity in those high light intensity regions of the image. A second measurement is made in a manner that captures the high light intensity regions at the expense of the low light intensity regions. The second measurement can be a second photodiode in the pixel sensor that has a much lower light sensitivity or a second, shorter exposure, using the same photodiode. The latter solution is not preferred in motion picture systems, as the time difference in the two exposures can lead to motion artifacts. The two-photodiode solution has the disadvantage of requiring larger pixel sensors. However, recent developments in photodiodes have provided a second low sensitivity photodiode within a conventional photodiode without significantly increasing the size of the pixel sensor.

While providing a second photodiode in each pixel sensor extends the high intensity response of a pixel sensor, various noise sources limit the extent to which the low light regions can be imaged at reasonable exposure times. While shot noise represents the minimum noise floor that can be obtained, other sources of noise are still significant, and hence, need to be reduced to further increase the dynamic range of an image sensor.

SUMMARY

The present invention includes an apparatus having a rectangular imaging array characterized by a plurality of pixel sensors and a plurality of readout lines. The apparatus has a plurality of column processing circuits, each column processing circuit being connected to a corresponding one of the readout lines and a plurality of signal injectors, one signal injector being connected to each of the readout lines. Each signal injector causes one of a predetermined number of voltages to be coupled to that readout line. A controller determines an exposure for each of the pixel sensors during each of a plurality of image recording periods. The controller also causes the signal injectors to inject a plurality of calibration voltages into the readout lines during each of a plurality of calibration periods, and determines a gain function of an amplifier in one of the column processing circuits by measuring an output of the amplifier for the plurality of calibration voltages, the calibration periods is between the imaging recording periods.

In one aspect of the invention, the controller causes the signal injectors to inject a signal that has a value that a pixel sensor would generate if that pixel sensor was not exposed to light, the controller determining a column offset value for each of the column processing circuits. In another aspect, there are a plurality of rows of signal injectors, each column processing circuit being connected to a plurality of the signal injectors. The controller averages the amplifier offset values generated by the signal injectors in determining the column offset value. In a still further aspect of the invention, the column offset value is determined during the calibration periods.

In a still further aspect of the invention, each of the pixel sensors includes first and second photodiodes, the first photodiode is characterized by a different light conversion efficiency than the second photodiode. In one exemplary embodiment, the second photodiode has a light conversion efficiency less than 1/30th of the first photodiode. In another aspect, the second photodiode includes a parasitic photodiode that includes a floating diffusion node that is also used to convert a charge generated by the first photodiode to a voltage.

In another aspect, the controller determines a ratio of the first photodiode light conversion efficiency to the second photodiode light conversion efficiency during the image recording periods. In one aspect of the invention, the controller determines the ratio by averaging signals from a plurality of pixel sensors in which the second photodiode generates a signal in a calibration range. In another aspect of the invention, the calibration range excludes pixel sensors in which the second photodiode has a dark current greater than a dark current threshold.

In another aspect of the invention, the pixel sensors are divided into color channels, each color channel having a corresponding color filter over the pixel sensors in that color channel, and the controller determines the ratio separately for each color channel.

In a still further aspect of the invention, the first photodiode measures exposures between a first exposure and a second exposure and wherein the second photodiode can measure light exposure between a third exposure and a fourth exposure, the third exposure is less than the second exposure and the fourth exposure is greater than the second exposure.

In another aspect of the invention, the controller uses the first photodiode to measure exposures less than the second exposure and the second photodiode to measure exposures greater than the second exposure to simulate a single photodiode that can measure exposures between the first and fourth exposures. In another aspect of the invention, the simulated single photodiode produces a first exposure value that is a linear function of the exposure and independent of the light conversion efficiencies of the first and second photodiodes and variations in the column processing circuitry for each of the pixel sensors. In a still further aspect of the invention, the first exposure value is characterized by a shot noise value and the controller outputs a second exposure value for each of the pixel sensors, the second exposure value is determined by the first exposure value, the second exposure value requiring fewer bits to output and differing from the first exposure value by an amount that is less than the shot noise value.

DETAILED DESCRIPTION

To simplify the following discussion, a pixel sensor is defined to be a circuit that converts light incident thereon to an electrical signal having a magnitude that is determined by the amount of light that was incident on that circuit in a period of time, referred to as the exposure. The pixel sensor has a gate that couples that electrical signal to a readout line in response to a signal on a row select line.

A rectangular imaging array is defined to be a plurality of pixel sensors organized as a plurality of rows and columns of pixel sensors. The rectangular array includes a plurality of readout lines and a plurality of row select lines, each pixel sensor being connected to one row select line and one readout line, the electrical signal generated by that pixel being connected to the readout line associated with that pixel in response to a signal on the row select line associated with that pixel sensor.

Figure 1:
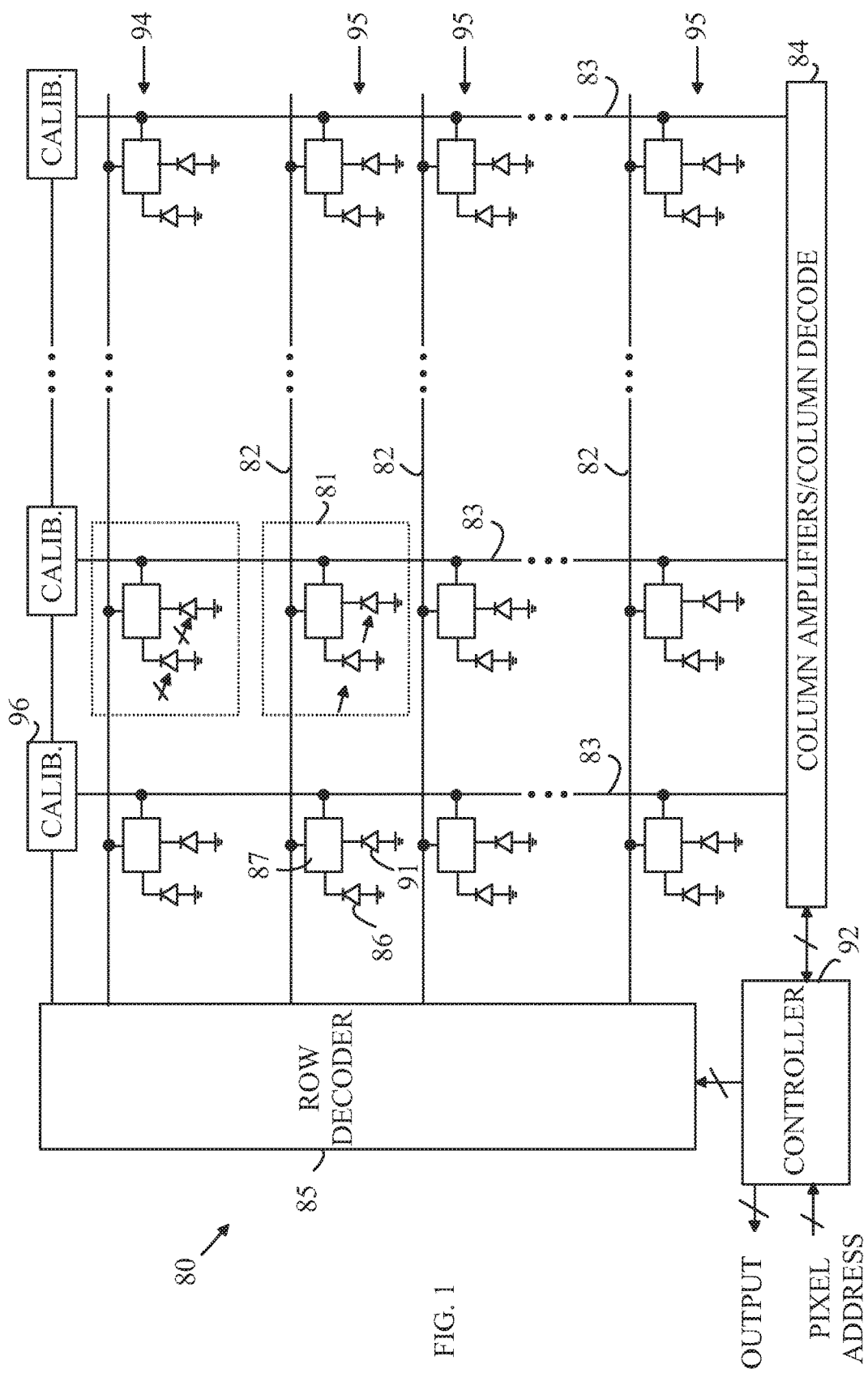
FIG. 1 illustrates a two-dimensional imaging array according to one embodiment of the present invention.

The manner in which the present invention provides its advantages can be more easily understood with reference to FIG. 1, which illustrates a two-dimensional imaging array according to one embodiment of the present invention. Rectangular imaging array 80 includes a pixel sensor 81. Each pixel sensor has a main photodiode 86 and a parasitic photodiode 91. The manner in which the pixel sensor operates will be discussed in more detail below. The reset circuitry and amplification circuitry in each pixel is shown at 87. The pixel sensors are arranged as a plurality of rows and columns. Exemplary rows are shown at 94 and 95. Each pixel sensor in a column is connected to a readout line 83 that is shared by all of the pixel sensors in that column. Each pixel sensor in a row is connected to a row select line 82 which determines if the pixel sensor in that row is connected to the corresponding readout line.

The operation of rectangular imaging array 80 is controlled by a controller 92 that receives a pixel address to be readout. Controller 92 generates a row select address that is used by row decoder 85 to enable the readout of the pixel sensors on a corresponding row in rectangular imaging array 80. The column amplifiers are included in an array of column amplifiers 84 which execute the readout algorithm, which will be discussed in more detail below. All of the pixel sensors in a given row are readout in parallel; hence there is one column amplification and ADC circuit per readout line 83. The column processing circuitry will be discussed in more detail below.

When rectangular imaging array 80 is reset and then exposed to light during an imaging exposure, each photodiode accumulates a charge that depends on the light exposure and the light conversion efficiency of that photodiode. That charge is converted to a voltage by reset and amplification circuitry 87 in that pixel sensor when the row in which the pixel sensor associated with that photodiode is readout. That voltage is coupled to the corresponding readout line 83 and processed by the amplification and ADC circuitry associated with the readout line in question to generate a digital value that represents the amount of light that was incident on the pixel sensor during the imaging exposure.

Ideally, each pixel sensor is identical to every other pixel sensor, is reset to the same voltage during readout, and generates a signal value of zero when no light impinges on rectangular imaging array 80. In addition, under ideal conditions each column application circuit is identical to every other column amplification circuit. There are four analog conversion factors in the chain of processing from light exposure of a photodiode to a final digital value. These are the light-to-charge conversion efficiencies of the photodiodes. The charge-to-voltage conversion is in the pixel reset and amplification circuitry 87, and there is the voltage amplification circuitry in the column processing circuitry. Differences in these analog conversion factors give rise to fixed pattern noise (FPN). The FPN can depend on factors that change over time and also depend on the temperature of the imaging array when the exposure is taken.

Figure 2:
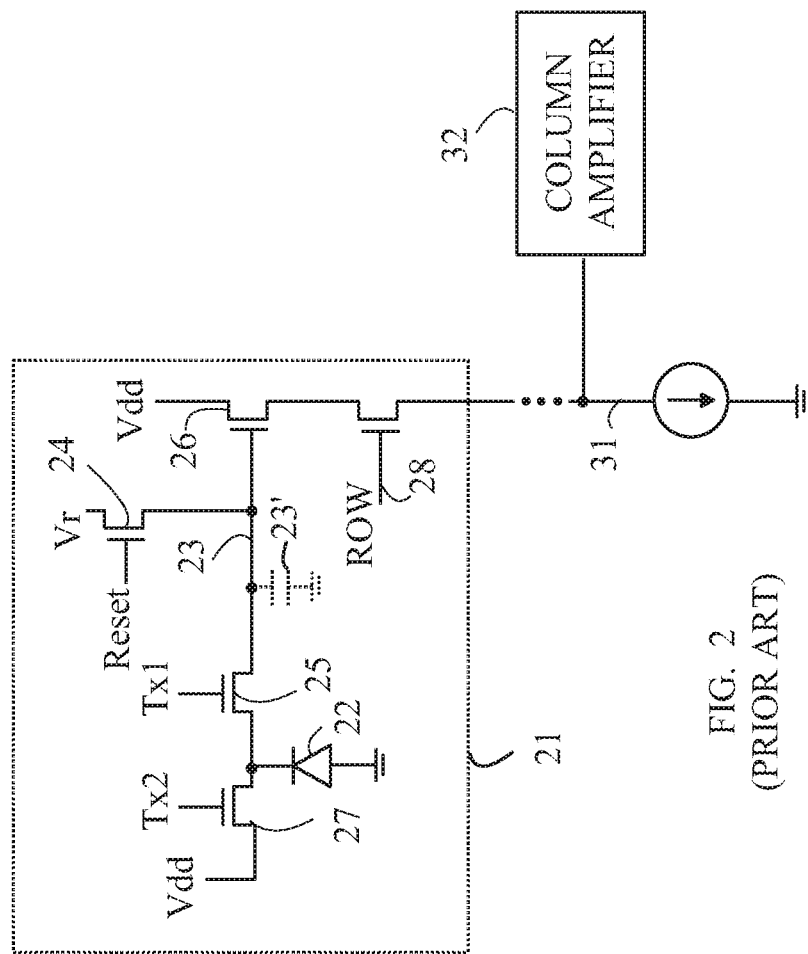
FIG. 2 illustrates a prior art pixel sensor.

In addition to FPN, there are other noise factors that must be reduced to obtain a noise factor that is small compared to the shot noise. Reset noise is an example of this type of noise. The manner in which reset noise is created can be more easily understood with reference to FIG. 2, which illustrates a prior art pixel sensor. FIG. 2 is a schematic drawing of a typical prior art pixel sensor in one column of pixel sensors in an imaging array. Pixel sensor 21 includes a photodiode 22 that measures the light intensity at a corresponding pixel in the image. Initially, photodiode 22 is reset by placing gate 25 in a conducting state and connecting floating diffusion node 23 to a reset voltage, Vr. Gate 25 is then closed and photodiode 22 is allowed to accumulate photoelectrons. A potential on gate 27 sets the maximum amount of charge that can be accumulated on photodiode 22. If more charge is accumulated than allowed by the potential on gate 27, the excess charge is shunted to ground through gate 27.

After photodiode 22 has been exposed, the charge accumulated in photodiode 22 is typically measured by noting the change in voltage on floating diffusion node 23 when the accumulated charge from photodiode 22 is transferred to floating diffusion node 23. Floating diffusion node 23 is characterized by a capacitance represented by capacitor 23'. In practice, capacitor 23' is charged to a voltage Vr and isolated by pulsing the reset line of gate 24 prior to floating diffusion node 23 being connected to photodiode 22. The charge accumulated on photodiode 22 is transferred to floating diffusion node 23 when gate 25 is opened. The voltage on floating diffusion node 23 is sufficient to remove all of this charge, leaving the voltage on floating diffusion node 23 reduced by an amount that depends on the amount of charge transferred and the capacitance of capacitor 23'. Hence, by measuring the change in voltage on floating diffusion node 23 after gate 25 is opened, the accumulated charge can be determined.

If the reset voltage on floating diffusion node 23 is sufficiently reproducible, then a single measurement of the voltage on floating diffusion node after reset is sufficient. However, noise results in small variations in the reset voltage. If this noise is significant, a correlated double sampling algorithm is utilized. In this algorithm, floating diffusion node 23 is first reset to Vr using reset gate 24. The potential on floating diffusion node 23 is then measured by connecting source follower 26 to readout line 31 by applying a select signal to line 28 to a readout gate. This reset potential is stored in column amplifier 32. Next, gate 25 is placed in a conducting state and the charge accumulated in photodiode 22 is transferred to floating diffusion node 23. It should be noted that floating diffusion node 23 is effectively a capacitor that has been charged to Vr. Hence, the charge leaving photodiode 22 lowers the voltage on floating diffusion node 23 by an amount that depends on the capacitance of floating diffusion node 23 and the amount of charge that is transferred. The voltage on floating diffusion node 23 is again measured after the transfer. The difference in voltage is then used to compute the amount of charge that accumulated during the exposure.

The present invention is based on the observation that a pixel of the type discussed above can be modified to include a second parasitic photodiode that is part of the floating diffusion node and has a significant photodiode detection efficiency. This second light detector does not significantly increase the size of the pixel, and hence, the present invention provides the advantages of a two-photodiode pixel without significantly increasing the pixel size.

Figure 3:
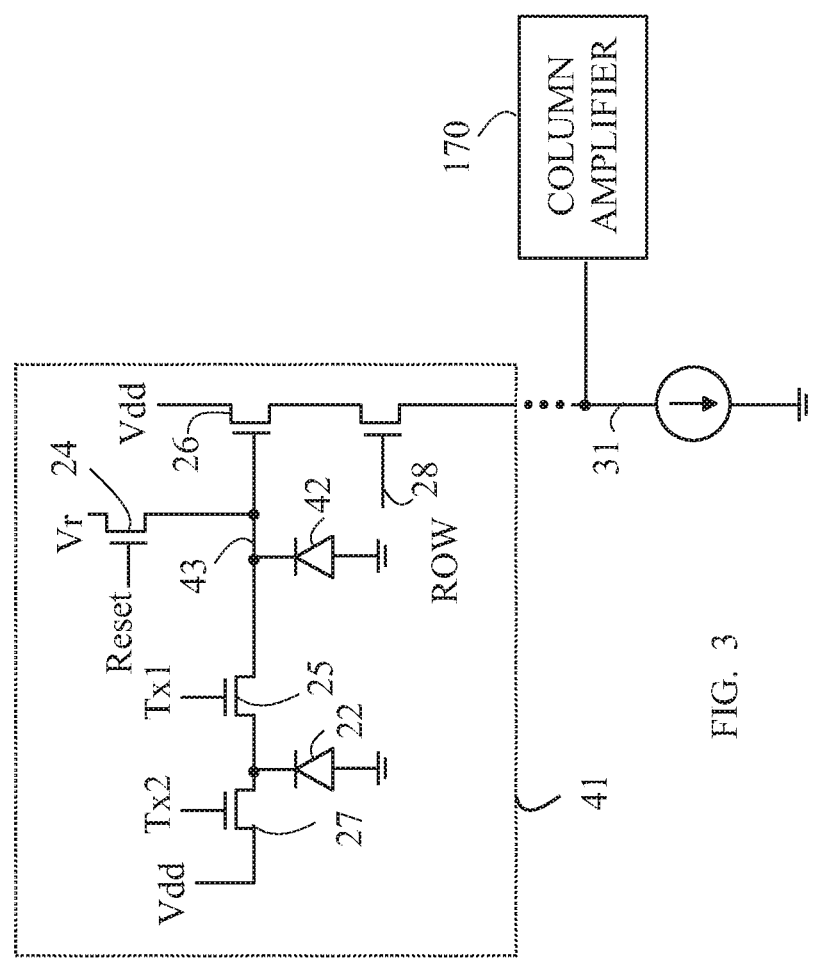
FIG. 3 illustrates a pixel sensor in which the parasitic photodiode is utilized in an image measurement.

To distinguish the parasitic photodiode from photodiode 22, photodiode 22 and photodiodes serving analogous functions will be referred to as the "conventional photodiode". Refer now to FIG. 3, which illustrates a pixel sensor in which the parasitic photodiode is utilized in an image measurement. To simplify the following discussion, those elements of pixel sensor 41 that serve functions analogous to those discussed above with respect to FIG. 1 have been given the same numeric designations and will not be discussed further unless such discussion is necessary to illustrate a new manner in which those elements are utilized. In general, parasitic photodiode 42 has a detection efficiency that is significantly less than that of photodiode 22. The manner in which the ratio of the photodiode detection efficiencies of the two photodiodes is adjusted is discussed in more detail in co-pending U.S. patent application Ser. No. 14/591,873, filed on Jan. 7, 2015. In one exemplary embodiment, the ratio of the conversion efficiency of the main photodiode to the parasitic photodiode is 30:1. Other embodiments in which this ratio is 20:1 or 15:1 are useful.

The manner in which pixel sensor 41 is utilized to measure the intensity of a pixel in one embodiment of the present invention will now be explained in more detail. The process may be more easily understood starting from the resetting of the pixel after the last image readout operation has been completed. Initially, main photodiode 22 is reset to Vr and gate 25 is closed. This also leaves floating diffusion node 43 reset to Vr. If a correlated double sampling measurement is to be made, this voltage is measured at the start of the exposure by connecting floating diffusion node 43 to column amplifier 170. Otherwise, a previous voltage measurement for the reset voltage is used. During the image exposure, parasitic photodiode 42 generates photoelectrons that are stored on floating diffusion node 43. These photoelectrons lower the potential on floating diffusion node 43. At the end of the exposure, the voltage on floating diffusion node 43 is measured by connecting the output of source follower 26 to column amplifier 170, and the amount of charge generated by parasitic photodiode 42 is determined to provide a first pixel intensity value. Next, floating diffusion node 43 is again reset to Vr and the potential on floating diffusion node 43 is measured by connecting the output of source follower 26 to column amplifier 170. Gate 25 is then placed in the conducting state and the photoelectrons accumulated by main photodiode 22 are transferred to floating diffusion node 43. The voltage on floating diffusion node 43 is then measured again and used by column amplifier 170 to compute a second pixel intensity value.

If the light intensity on the corresponding pixel was high, main photodiode 22 will have overflowed; however, parasitic photodiode 42, which has a much lower conversion efficiency, will have a value that is within the desired range. On the other hand, if the light intensity was low, there will be insufficient photoelectrons accumulated on parasitic photodiode 42 to provide a reliable estimate, and the measurement from main photodiode 22 will be utilized.

The double correlated sampling corrects for reset noise. In addition to reset noise, noise arises from the conversion of the analog voltage on readout lines 83 to a digital value by the ADC associated with that readout line. In the simplest case, the ADC converts the voltage input thereto to a digital value that is related to the voltage V, by V=NS, where N is the digital value and S is the step size of the ADC. Given an N value and the known value of S, the reconstructed voltage value will differ from the original by an error that is half the step size. This error gives rise to noise that will be referred to as digitization noise in the following discussion. This digitization noise is added to the shot noise in the final digital representation of the light exposure for each pixel. The shot noise is approximately equal to the square root of the number of photons that were converted to photoelectrons in the photodiode. Hence, the shot noise increases with increasing light exposure. In low light conditions, the shot noise, in absolute terms, is small, and hence, the digitization noise can be significant if S is small. However, if S is small, the number of bits that must be used in the ADC to represent the entire range of input voltages becomes large. Given the large number of ADCs in an imaging array, the increase in cost becomes significant.

In principle, an ADC that has a variable step size can be utilized to digitize the column voltages. However, the additional circuitry for changing the step size as a function of input voltage increases the cost of the ADC. In such an arrangement, the output of the ADC is a non-linear function of the input voltage, small input voltages being digitized with a smaller step size. While this arrangement allows the system to maintain the digitization noise at a level that is small compared to the shot noise, the ADC needs to be able to function over the entire range of voltage values that may be generated in any image.

Figure 4:
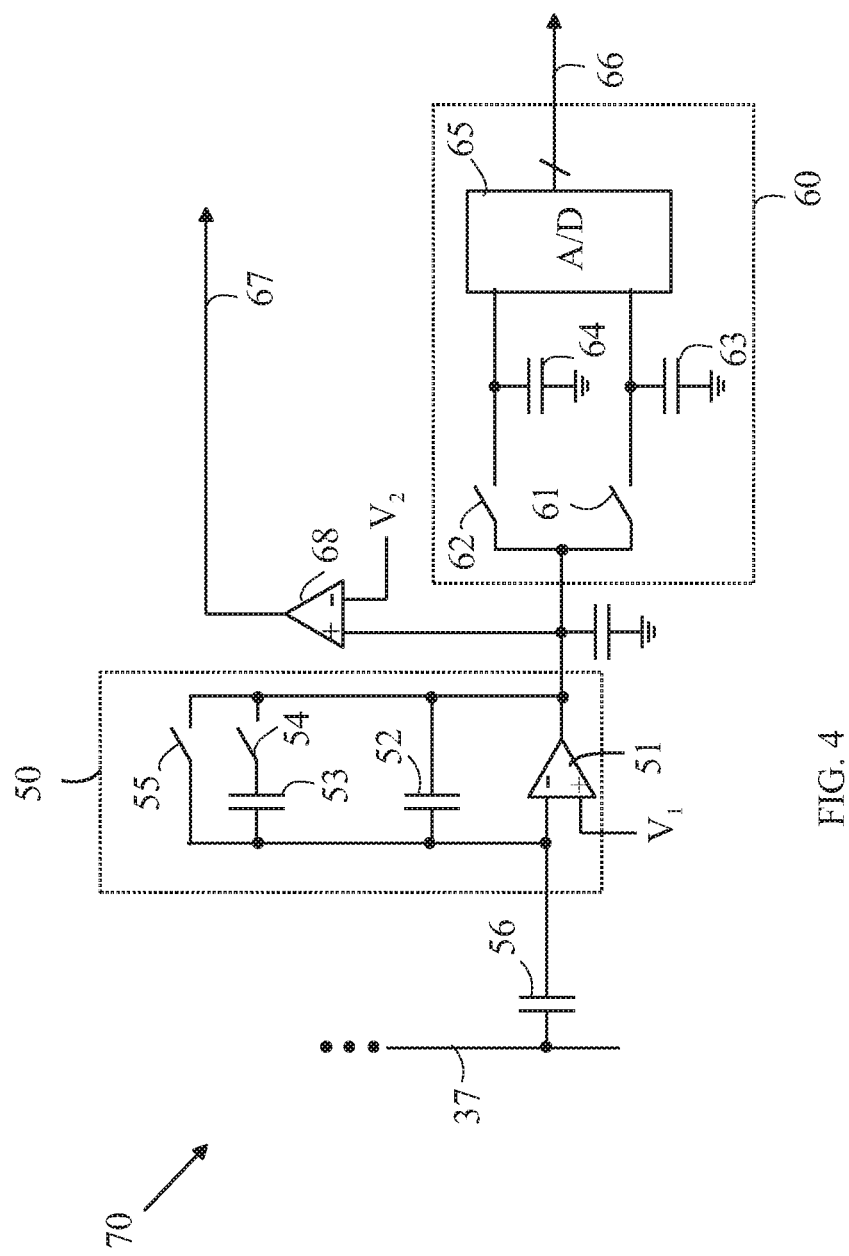
FIG. 4 illustrates a column amplifier and ADC according to one embodiment of the present invention.

The present invention avoids these problems by using a dual gain amplifier to amplify the signal on the corresponding readout line 83. A single ADC then digitizes the output of the amplifier. Changing the amplification factor is equivalent to changing the step size of the ADC. In addition, the range of voltages over which the ADC must operate is reduced. Refer now to FIG. 4, which illustrates a column amplifier and ADC according to one embodiment of the present invention. This column processing circuit is described in detail in co-pending U.S. patent application Ser. No. 14/097,162, filed on Dec. 4, 2013, which is hereby incorporated by reference. For the purposes of the present discussion column processing circuit 70 amplifies and processes the signals on bit line 37. Capacitive transimpedance amplifier 50 is constructed from an operational amplifier 51 and two feedback capacitors shown at 52 and 53 having capacitances $C_{52}$ and $C_{53}$, respectively. When switch 54 is open, the gain of capacitive transimpedance amplifier 50 is proportional to $C_{56}/C_{52}$, where $C_{56}$ is the capacitance of capacitor 56. When switch 54 is closed, capacitors 52 and 53 are connected in parallel, and the gain of capacitive transimpedance amplifier 50 is proportional to $C_{56}/(C_{52}+C_{53})$. The state of switch 54 is set by latching comparator 68 that compares the output of capacitive transimpedance amplifier 50 with a reference voltage, $V_2$. In one embodiment, $C_{56}/(C_{52}+C_{53})$ is approximately 1, and $C_{56}/C_{52}$ is between 20 and 30.

In operation, switch 54 is controlled by the output of a latching comparator shown at 68 and by controller 92 shown in FIG. 1. Prior to each voltage measurement on bit line 37, latching comparator 68 is reset and switch 55 is closed to short the input and output of operational amplifier 51. Initially, switch 54 is open, and operational amplifier 51 has its maximum gain. When a signal is transferred to capacitor 56 for measurement, the output of operational amplifier 51 rises. If the output of operational amplifier 51 exceeds $V_2$, latching comparator 68 is set thereby generating a signal on line 67 which is used to close switch 54. The gain of capacitive transimpedance amplifier 50 is thus reduced to the low value. After capacitive transimpedance amplifier 50 has settled, the output voltage is stored on either capacitor 63 or capacitor 64 in double sampling circuit 60 depending on the state of switches 61 and 62, respectively. When both the reset value and the value representing the stored charge on the photodiode in the pixel currently connected to bit line 37 are stored on capacitors 64 and 63, respectively, the difference in potential is digitized by ADC 65 and the value output on line 66 together with a value indicative of the gain value of capacitive transimpedance amplifier 50 on line 67.

When the light level stored in the pixel that is connected to bit line 37 is low, capacitive transimpedance amplifier 50 and the associated correlated double sampling circuitry behave as a conventional column processing circuit in that the gain of capacitive transimpedance amplifier 50 is at the high value for both the reset and measurement phases of the correlated double sampling. When the light level is high; however, the gain used to measure the reset potential will be different than the gain used to measure the charge that was transferred from the photodiode. Hence, the difference computation will be in error. In many cases, this does not cause a significant problem, because the correlated double sampling computation only provides a significant difference from the value that would be obtained by just measuring the charge that was stored in the photodiode in cases where the photodiode charge is small. However, if a correction for this error is needed, a modified double sampling circuit in which the observed reset value is divided by an appropriate factor that depends on the difference in gain of the two phases can be utilized.

Capacitive transimpedance amplifier 50 can be viewed as a capacitive transimpedance amplifier with a variable capacitive feedback circuit as the feedback loop. The feedback capacitance is set to maintain the output signal below a predetermined signal level. While the embodiment shown in FIG. 4 has two gain levels, additional gain levels can be set by providing more feedback capacitors, each with a separately activated switch. As will be explained in more detail below, in one embodiment of the present invention, capacitive transimpedance amplifier 50 has four gain levels. Two gains are used for processing the signal from the parasitic photodiode and two gains are used for processing the signal from the main photodiode.

As noted above, an ideal pixel sensor would generate a signal of zero when no light is directed onto the imaging array. However, in practice, even a dark pixel signal has some small signal. This dark signal can vary from exposure to exposure in response to temperature changes and other factors. In addition, the readout circuitry comprising the amplifiers, correlated double sampling, and ADC in each row can have a non-zero offset. In principle, this source of noise can be reduced by including one or more optically black rows in the imaging array by masking the pixel sensors in those rows. An exemplary optically black row is shown at 94 in FIG. 1. In this type of correction scheme, the signal from this row, or an average of signals from a plurality of such rows is subtracted from the signals generated by the other non-black pixel sensors when processing each pixel sensor in a row.

Unfortunately, adequately masking the pixel sensors to provide an optically black row poses significant challenges as light can be reflected from other portions of the imaging array into the pixel sensors in the optically black row. While this source of noise can be acceptable in a conventional imaging array, it poses significant problems in an imaging array having the dynamic range of the imaging arrays according to the present invention.

Figure 5:
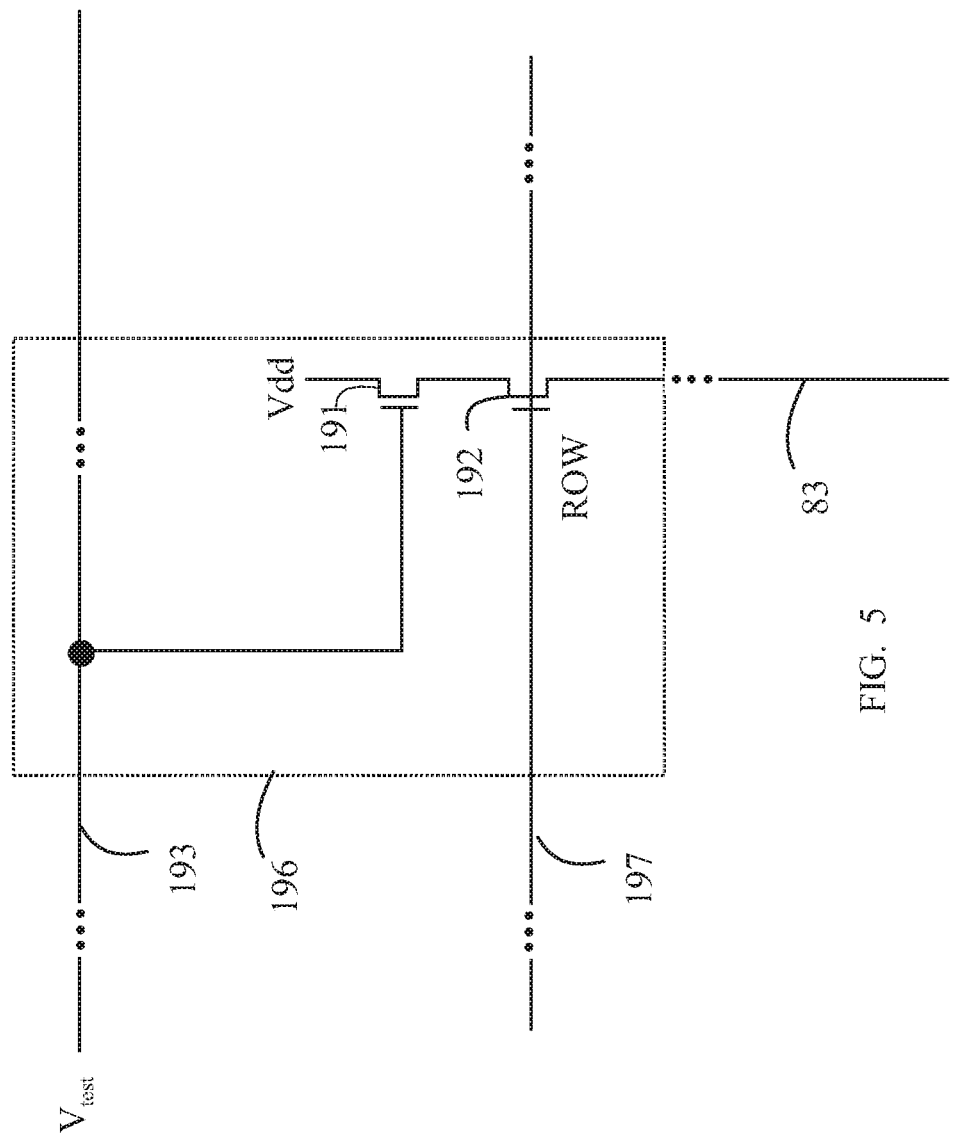
FIG. 5 illustrates a signal injector that is readout on a readout line 83 in response to a row select signal on line 197.

The present invention provides a second "black" signal that can be used to correct for the offsets in the column processing circuitry. This signal is generated by the column calibration circuits 96 shown in FIG. 1. In one aspect of the invention, the calibration circuits include a number of rows of signal injectors. Refer to FIG. 5, which illustrates a signal injector that is readout on a readout line 83 in response to a row select signal on line 197. Signal injector 196 includes a source follower 191 and a select gate 192, that are the same as the corresponding elements in the pixel sensors. Signal injector 196 receives a test signal on bus 193 that is coupled to the gate of source follower 191. Hence, the output of signal injector 196 is a voltage that reflects the voltage that would be generated by a pixel sensor that had a voltage $V_{test}$ at its gate.

The resulting signal on readout line 83 is processed by the corresponding column processing circuitry in the same manner as a signal from a pixel sensor. In particular, correlated double sampling is applied during the processing of the signal. That is, $V_{test}$ is first set to the reset voltage Vr and the signal processed. Next, $V_{test}$ is set to another voltage to provide a test signal that is processed after subtracting the previous signal. If the signal is set to Vr during both steps, the resulting signal at the ADC in the column processing circuitry should be zero, which would be the result if a pixel did not receive any light. Hence, this value will be referred to as electrical black (EB).

In one aspect of the invention, there are several such signal injectors connected to each readout line. The resulting EB signals are averaged to provide an average EB signal that is subtracted from signals from normal pixel sensors to produce the final pixel sensor values which reflect the actual light exposure received by each pixel sensor. The average EB value has reduced noise. The EB values can change slowly with environmental variables such as temperature. Hence, a running average of the EB values is maintained for each column of pixel sensors. At predetermined intervals, additional EB values are measured and added to this running average and older EB values are discarded.

The signal injectors are also used to calibrate the column processing circuitry during the operation of the imaging sensor. As noted above, the variations in the amplifiers, ADCs and the other components in the readout circuitry across columns cause Column Fixed Pattern Noise (CFPN) in CMOS sensors. CFPN is a major contributor of image quality degradation in low light and/or low contrast (e.g. an illuminated white paper) scenes. CFPN can be viewed as having two components, offset CFPN and gain CFPN. A column amplifier amplifies the input signal and adds some offset to that amplified signal. The present invention is based on the observation that the offset CFPN is independent of the input signal to the column amplifier; however, the gain CFPN depends on the input signal magnitude as well as the individual amplifier, as the gain is not completely constant over the range of voltages presented on the corresponding readout line. The gain function of an amplifier is defined to be the gain of the amplifier as a function of the input voltage to that amplifier. In addition, the gain and offset CFPNs vary with time and environmental variables such as the temperature of the imaging array.

The subtraction of the average EB signal for a column corrects for offset CFPN in that column. This is part of the processing of each frame, and hence, takes into account both fixed offset CFPN and changes in the fixed offset CFPN over time and other slowly varying environmental factors.

In prior art imaging arrays, the gain CFPN is corrected using pre-calibrated coefficient(s) for each column after an offset CFPN correction has been made. The calibration step is usually fulfilled at the factory and stays unchanged for the camera life. Hence, this approach does not correct for the temporal gain variation. As a result, significant gain CFPN is still present.

The present invention includes a dynamic gain CFPN compensation scheme in addition to the offset CFPN correction. The amplifiers in the column processing circuitry have four nominal gain settings. Two of these gain settings, referred to as the high and low main photodiode gain settings, are used to process the signal from the main photodiode. Similarly, two of these gain settings, referred to as the high and low parasitic photodiode gain settings, are used to process the signal from the parasitic photodiode. Hence, there are four amplifier gains that must be calibrated and gain as a function of voltage stored for each amplifier gain.

Referring again to FIG. 1, rectangular imaging array 80 includes column calibration circuits 96 that generate calibration signals which are fed into column amplifiers and the downstream circuits when the amplifiers are set to each of the gain settings. In one aspect of the present invention, the injectors discussed above are used to generate known voltages on the readout lines to provide the calibration signals. The calibration signals are also processed using double correlated sampling; however, the second voltage in the sequence is set to a voltage below Vr to provide a signal of known magnitude, so that the processed value of the signal through the column processing circuitry can be determined. The resulting offset and gain profiles are stored in a memory that is part of the system controller. The different calibration signal levels are generated in the background when the sensor is running. Then a correction algorithm is applied by using these stored profiles to correct the CFPN. Since these profiles are dynamically generated and the correction algorithm keeps running in the background as the sensor is running, the system controller is able to track column variations and apply the corresponding compensations when sensor running conditions change (e.g., temperature, supply voltage, etc.).

As noted above, the present invention utilizes pixel sensors having two photodiodes per pixel sensor, a main photodiode and a parasitic photodiode. The main photodiode is adapted for low light detection, and hence, has a high light conversion gain and is a pinned photodiode to reduce noise. The parasitic photodiode is adapted for high light detection and has a low light conversion gain. In addition, the signals from each of the photodiodes can be the results obtained with the two different column gain levels. These results are combined to generate a digital light measurement that would have been obtained if the main photodiode had the extended range and the signal from that photodiode was processed using a single amplification gain.

The signal from the low sensitivity parasitic photodiode extends the useful range of the pixel sensor. When the parasitic photodiode is supplying the light intensity value, the parasitic photodiode measurement needs to be converted to a value that would have been obtained from the main photodiode if the main photodiode did not saturate. To provide this extension, the relative gains of the two photodiodes need to be known. The ratio of the two gains depends on the average wavelength of the light received by the photodiodes, and hence, must be calibrated for the different color channels in the imaging array. However, even within a given color channel, there are variations that depend on the color temperature of the incident light. Hence, in the present invention, the ratio is calibrated for each image.

The relative sensitivities of the main and parasitic photodiodes are set such that there is a range of incident light intensities that provide useful signals for both photodiodes in the same pixel sensor. To be suitable for the calibration, the light intensity must be between a first intensity value that is less than the intensity at which the main photodiode saturates and a second intensity value that is greater than the minimum intensity at which the parasitic photodiode provides a meaningful signal. During the readout of the imaging array, the EB offset is removed from the column signals and those signals that are within the calibration range are identified. The ratio of the two photodiode signals for these pixels is computed and added to a running average calibration ratio that is used to compute the light intensity for all the pixel sensors in that color channel for which the parasitic photodiode signal provides the light measurement.

In one aspect of the invention, each pixel in the final image is computed from the output of four pixel sensors that are adjacent to one another. Two of the pixel sensors, G1 and G2, are covered by green filters and the remaining two pixel sensors, R and B, are covered by red and blue filters, respectively. The pixel sensors that are covered by the same color pixel within the imaging array are referred to as a "color channel". The pixel sensors have some degree of cross-talk. That is, a light input in the red spectral region generates a non-zero response in the other color pixel sensors in the four pixel group. It has been observed that the cross-talk is different for G1 and G2. Hence, the calibration ratio is computed separately for each of the green sensors; that is, the two green sensors are treated as separate color channels in this aspect of the present invention.

The calibration ratio of the main photodiode to the parasitic photodiode depends on the dark current in both photodiodes being negligible. While this assumption is true for the main photodiode, the dark current in the parasitic photodiodes can vary beyond the tolerable limit. Pixel sensors in which the parasitic photodiode has a large dark current will be referred to as "hot pixels". These pixels must be excluded from the running average for the calibration ratio in each color channel. In one aspect of the invention, calibration ratio values that are outliers in the statistical distribution of calibration ratio values are not used to compute the running average.

If a particular embodiment of an imaging array according to the present invention has sufficient memory, the controller can store a list of hot pixels as determined by a calibration procedure that is performed at the factory. In this case, calibration ratios for these pixels are never used to provide the running average.

For each pixel sensor, the parasitic and main photodiode signals are digitized. The digital value includes the amplification gain used by the column amplifier prior to digitization. Assume that the gain of the amplifier was constant over the corresponding input voltage ranges. Then the light intensity is the product of a "step size" related to the gain and the digital value from the ADC. As noted above, the gain is not necessarily constant for a given amplifier gain, but depends to some extent on the input voltage, and hence, the digital value. Controller 92 stores a table of gains for each column amplifier.

As noted above, the goal of the blending of the outputs from the main photodiode and the parasitic photodiode is to provide a signal value that is a linear function of the light exposure at the corresponding pixel sensor. The dynamic range of an image sensor according to the present invention can be as high as $10^6$. To adequately represent this linear value over the entire range of exposures a 24-bit integer is required. Hence, the output bus from controller 92 would need to be a 24-bit bus. The power needed to drive such a large bus at the speeds needed in a surveillance or other motion picture camera is significant. Hence, in one aspect of the invention, the final exposure value is compressed to a much smaller number of bits.

At low exposures, the most significant bits of the digital value are zeros. At high exposures, the digital values in the high bits are important; however, the values in the least significant bits are dominated by shot noise, and hence, provide little useful information. Hence, those values can be replaced by zeros or any other value without significantly altering the exposure values. In one aspect of the invention, the linear exposure value is transformed to a compressed exposure value using a non-linear transformation that is chosen such that the highest compressed digital value requires significantly fewer bits than the non-compressed digital value.

Consider a table of threshold $V_i$ values. If an exposure digital, V, is greater than or equal to $V_i$ and less than $V_{i+1}$, V is replaced by i. Here, i=1 to Nt. Upon decompression, V is replaced by $V_i$. The table values, $V_i$ are chosen such that the difference between $V_i$ and $V_{i+1}$ is less than the shot noise in a signal having the value $V_i$. In addition, the number of entries in the table are chosen such that Nt<<$V_{max}$, where $V_{max}$ is the largest pixel signal. In an exemplary embodiment, the linear exposure values require 24 bits, but the maximum value of i requires only 14 bits. Hence, a substantial saving in the number of output values is achieved.

The above-described embodiments utilize pixel sensors having a main photodiode and parasitic photodiode. However, the teachings of the present invention can be applied to reduce the CFPN in imaging arrays in which the pixel sensors have two conventional photodiodes. In general, the first photodiode can measure exposures in a first band of exposures characterized by a first and a second exposure limit. The second photodiode measures exposures in a second band of exposures characterized by a third and a fourth exposure limit. The first and second bands overlap; that is, the third exposure limit is greater than the first exposure limit and less than the second exposure limit, and the fourth exposure limit is greater than the second exposure limit. The present invention preferably uses the parasitic photodiode as the second photodiode because the resulting imaging sensor is substantially smaller, and hence, less expensive than an imaging sensor that utilizes two conventional photodiodes and an extra internal gate to determine which photodiode is currently connected to the floating diffusion node.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claim.

What is claimed is:

1. An apparatus comprising
a rectangular imaging array characterized by a plurality of pixel sensors and a plurality of readout lines;
a plurality of column processing circuits, each column processing circuit being connected to a corresponding one of said plurality of readout lines;
a plurality of signal injectors, one signal injector being connected to each of said readout lines, each signal injector causing one of a predetermined number of voltages to be coupled to that readout line; and
a controller that determines an exposure for each of said plurality of pixel sensors during each of a plurality of image recording periods, causes said signal injectors to inject a plurality of calibration voltages into said readout lines during each of a plurality of calibration periods, and determines a gain function of an amplifier in one of said plurality of column processing circuits by measuring an output of said amplifier during said plurality of calibration periods, said plurality of calibration periods being between said image recording periods.

2. The apparatus of claim 1 wherein said controller causes said signal injectors to inject a signal that has a value that a pixel sensor would generate if that pixel sensor was not exposed to light, said controller determining a column offset value for each of said plurality of column processing circuits.

3. The apparatus of claim 2 further comprising a plurality of rows of signal injectors, each column processing circuit being connected to a plurality of said signal injectors, said controller averaging said column offset values generated by said signal injectors in determining said column offset value.

4. The apparatus of claim 2 wherein said column offset value is determined during plurality of said calibration periods.

5. The apparatus of claim 1 wherein each of said plurality of pixel sensors comprises first and second photodiodes, said first photodiode being characterized by a different light conversion efficiency than said second photodiode.

6. The apparatus of claim 5 wherein said second photodiode has a light conversion efficiency less than 1/30th of said first photodiode.

7. The apparatus of claim 6 wherein said second photodiode comprises a parasitic photodiode that includes a floating diffusion node that is also used to convert a charge generated by said first photodiode to a voltage.

8. The apparatus of claim 5 wherein said controller determines a ratio of said first photodiode light conversion efficiency to said second photodiode light conversion efficiency during said plurality of image recording periods.

9. The apparatus of claim 8 wherein said controller determines said ratio by averaging signals from a plurality of pixel sensors in which said second photodiode generates a signal in a calibration range.

10. The apparatus of claim 9 wherein said calibration range excludes pixel sensors in which said second photodiode has a dark current greater than a dark current threshold.

11. The apparatus of claim 8 wherein said plurality of pixel sensors are divided into color channels, each color channel having a corresponding color filter over pixel sensors in that color channel, and wherein said controller determines said ratio separately for each of said color channels.

12. The apparatus of claim 5 wherein said first photodiode measures exposures between a first exposure and a second exposure and wherein said second photodiode can measure light exposure between a third exposure and a fourth exposure, said third exposure being less than said second exposure and said fourth exposure being greater than said second exposure.

13. The apparatus of claim 5 wherein said controller uses said first photodiode to measure exposures less than said second exposure and said second photodiode to measure exposures greater than said second exposure to simulate a single photodiode that can measure exposures between said first and fourth exposures.

14. The apparatus of claim 13 wherein said simulated single photodiode produces a first exposure value that is a linear function of said exposure and independent of said light conversion efficiencies of said first and second photodiodes and variations in said plurality of column processing circuits.

15. The apparatus of claim 14 wherein said first exposure value is characterized by a shot noise value and said controller outputs a second exposure value for each of said plurality of pixel sensors, said second exposure being determined by said first exposure value, said second exposure requiring fewer bits to output and differing from said first exposure by an amount that is less than said shot noise value.

* * * * *